United States Patent
Miyajima

(10) Patent No.: US 9,461,019 B2
(45) Date of Patent: Oct. 4, 2016

(54) SEMICONDUCTOR DEVICE AND METHOD FOR MAKING THE DEVICE

(71) Applicant: Panasonic Intellectual Property Management Co., Ltd., Osaka (JP)

(72) Inventor: Hiroki Miyajima, Osaka (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 0 days.

(21) Appl. No.: 14/948,128

(22) Filed: Nov. 20, 2015

(65) Prior Publication Data
US 2016/0079209 A1    Mar. 17, 2016

Related U.S. Application Data

(63) Continuation of application No. PCT/JP2014/000851, filed on Feb. 19, 2014.

(30) Foreign Application Priority Data

Jun. 3, 2013 (JP) ................. 2013-116823

(51) Int. Cl.
*H01L 25/065* (2006.01)
*H01L 23/48* (2006.01)
(Continued)

(52) U.S. Cl.
CPC ......... *H01L 25/0657* (2013.01); *H01L 21/561* (2013.01); *H01L 23/3107* (2013.01);
(Continued)

(58) Field of Classification Search
CPC ............. H01L 21/28518; H01L 21/28556; H01L 21/76843; H01L 21/76855; H01L 23/5226

USPC ......................................................... 257/770
See application file for complete search history.

(56) References Cited

U.S. PATENT DOCUMENTS

2007/0029646 A1    2/2007 Voldman
2013/0037965 A1    2/2013 Morimoto et al.
(Continued)

FOREIGN PATENT DOCUMENTS

JP    2000-252408 A    9/2000
JP    2007-043172 A    2/2007
(Continued)

OTHER PUBLICATIONS

Maeda, N. et al. "Development of Ultra-Thin Chip-on-Wafer Process using Bumpless Interconnects for three-Dimensional Memory/Logic Applications". Symposium on VLSI Technology Digest of Technical Papers. 2012. pp. 171-172.
(Continued)

*Primary Examiner* — Walter H Swanson
(74) *Attorney, Agent, or Firm* — McDermott Will & Emery LLP

(57) ABSTRACT

Disclosed herein is a semiconductor device including: a first substrate provided with a first surface layer including a first electrode; an expanded second substrate provided with a second surface layer including a second electrode and directly bonded to the first substrate so that the second surface layer contacts with the first surface layer; and a through electrode running through the first or second substrate. The second surface layer is provided over an expanded second principal surface defined by a second substrate and a resin portion. The second substrate has a smaller planar size than the first substrate. The first and second electrodes are connected together and in contact with each other.

18 Claims, 7 Drawing Sheets

(51) Int. Cl.
  *H01L 25/18* (2006.01)
  *H01L 23/31* (2006.01)
  *H01L 21/56* (2006.01)
  *H01L 23/538* (2006.01)
  *H01L 23/00* (2006.01)
  *H01L 25/00* (2006.01)

(52) U.S. Cl.
  CPC ......... *H01L23/481* (2013.01); *H01L 23/5389* (2013.01); *H01L 24/09* (2013.01); *H01L 24/19* (2013.01); *H01L 24/80* (2013.01); *H01L 24/94* (2013.01); *H01L 24/96* (2013.01); *H01L 24/97* (2013.01); *H01L 25/18* (2013.01); *H01L 25/50* (2013.01); *H01L 21/568* (2013.01); *H01L 23/3114* (2013.01); *H01L 2224/0237* (2013.01); *H01L 2224/04105* (2013.01); *H01L 2224/0557* (2013.01); *H01L 2224/05124* (2013.01); *H01L 2224/05147* (2013.01); *H01L 2224/05155* (2013.01); *H01L 2224/05184* (2013.01); *H01L 2224/05552* (2013.01); *H01L 2224/08145* (2013.01); *H01L 2224/08146* (2013.01); *H01L 2224/94* (2013.01); *H01L 2224/97* (2013.01); *H01L 2225/06513* (2013.01); *H01L 2225/06541* (2013.01); *H01L 2225/06568* (2013.01); *H01L 2924/00014* (2013.01); *H01L 2924/05042* (2013.01); *H01L 2924/05442* (2013.01); *H01L 2924/146* (2013.01); *H01L 2924/1434* (2013.01); *H01L 2924/18162* (2013.01)

(56) References Cited

U.S. PATENT DOCUMENTS

2013/0134559 A1* 5/2013 Lin .................. H01L 23/49827
                                                        257/620
2014/0124957 A1* 5/2014 Iwase ................. H01L 23/5389
                                                        257/777

FOREIGN PATENT DOCUMENTS

| JP | 2010-238898 A | 10/2010 |
| JP | 2011-169854 A | 9/2011 |
| WO | 2012-157167 A1 | 11/2012 |
| WO | WO 2013073082 | * 5/2013 |

OTHER PUBLICATIONS

International Search Report dated May 20, 2014, issued in corresponding International Application No. PCT/JP2014/000851. 5 pages. (w/ English translation).

* cited by examiner

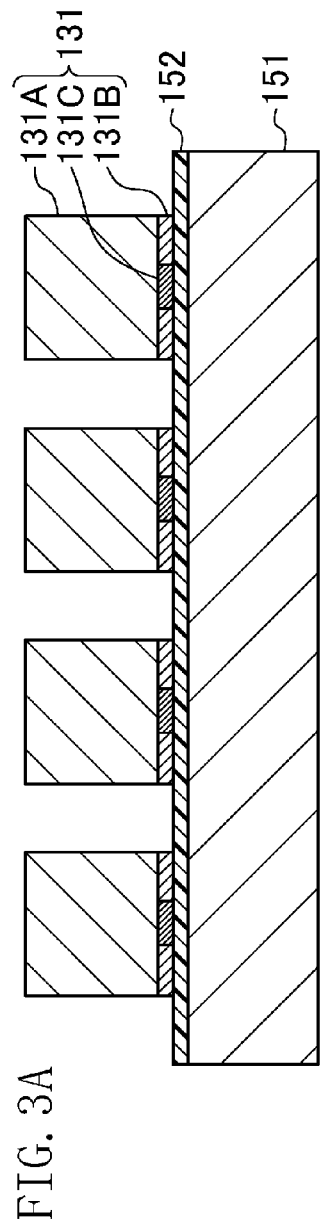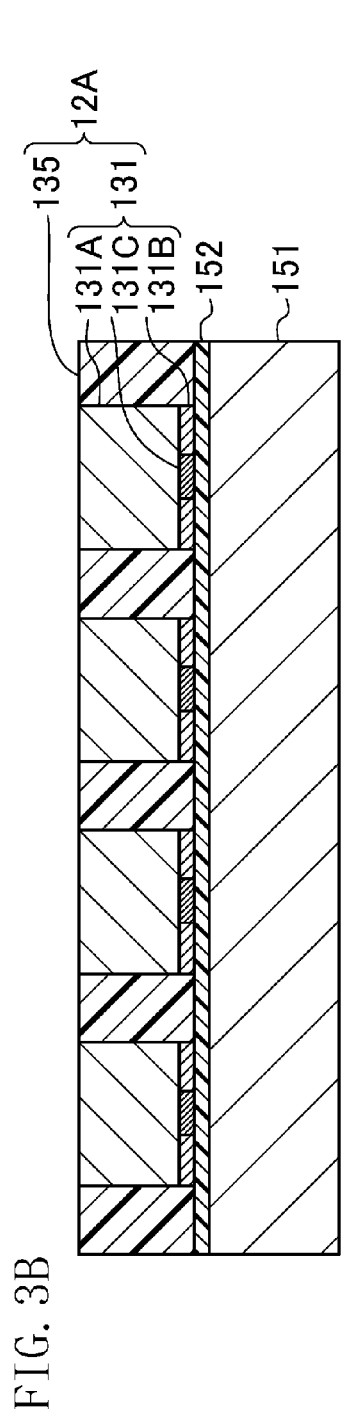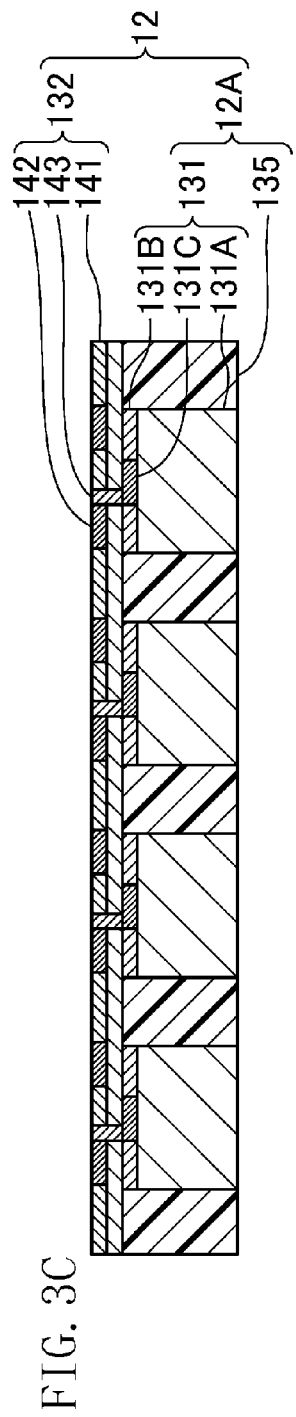

SEMICONDUCTOR DEVICE AND METHOD FOR MAKING THE DEVICE

CROSS-REFERENCE TO RELATED APPLICATION

This is a continuation of International Application No. PCT/JP2014/000851 filed on Feb. 19, 2014, which claims priority to Japanese Patent Application No. 2013-116823 filed on Jun. 3, 2013. The entire disclosure of this application is hereby incorporated by reference.

BACKGROUND

The present disclosure relates to a semiconductor device and a method for making the device.

Recently, as the performances and functionalities of semiconductor devices have been further enhanced, there have been growing demands for 3D die stacking technologies for stacking a plurality of chips (dies) vertically one upon the other as a possible replacement for conventional 2D implementation technologies, which are typically implemented as a system on chip (SoC), for example. Among other things, 3D die stacking technologies for semiconductor chips with through electrodes (which are typically configured as "through silicon vias (TSVs)") have been developed particularly extensively. However, those 3D die stacking technologies for semiconductor chips with through electrodes are not without serious problems. One of those serious problems is an increase in manufacturing cost. Thus, to cut down the manufacturing cost, wafer-on-wafer stacking has attracted a lot of attention these days as an alternative to the conventional chip-on-chip stacking technique.

To make wafer-on-wafer stacking, however, each pair of chips provided on two wafers to be stacked one upon the other need to have exactly the same size and pitch. For that reason, when two chips of the same kind with exactly the same chip size, such as two memory chips, are going to be stacked one upon the other, wafer-on-wafer stacking is not so difficult a hurdle to overcome. However, if two chips of mutually different kinds, such as a memory chip and a logic chip or a digital chip and an analog chip, are going to be stacked one upon the other, at least one of the two wafers should have a dead zone. The reason is that the size and pitch of each chip on one wafer need to be the same as those of its associated chip on the other wafer. This increases the cost inevitably. On top of that, unless the wafer-on-wafer stacking process is designed cooperatively with not only the chip sizes and pitches but also electrode layouts and all the other parameters coordinated with each other, it is difficult to carry out the wafer-on-wafer stacking process.

Thus, in order to carry out a wafer-on-wafer stacking process even when the chips are not designed cooperatively, somebody proposed a stacking method using a wafer expanded with a resin (see, for example, N. Maeda et al., Development of Ultra-Thin Chip-on-Wafer Process Using Bumpless Interconnects for Three-Dimensional Memory/Logic Applications, Symposium on VLSI Technology, Digest of Technical Papers, pp. 171-172, 2012). Such a wafer expanded with a resin (which will be hereinafter referred to as a "resin-expanded wafer") is obtained by rearranging a number of chips, which have been cut out of one of the two wafers, on a supporting wafer so that those chips have the same pitch as chips on the other wafer, filling the gap between the chips with a resin, and then planarizing the upper surface. People hope that the wafer-on-wafer stacking process could be carried out by using such a resin-expanded wafer, even if the chips are not designed cooperatively.

SUMMARY

According to the conventional wafer-on-wafer stacking technique using such a resin-expanded wafer, a resin-expanded, smaller chip is stacked face-to-back on a lower chip of a larger size. Thus, through electrodes are provided in the resin-expanded portion of the upper chip in order to connect the upper chip to the lower chip. In that case, however, the through electrodes need to be provided so as to run through multiple layers of mutually different materials including a silicon layer, a resin layer and an adhesive layer. This makes the process design difficult. In addition, the lower chip needs to have interconnects of a large area in order to establish connection with the through electrodes, which imposes constraint on the layout design.

Thus, the present disclosure provides a semiconductor device that allows for carrying out wafer-on-wafer stacking easily.

An implementation of a semiconductor device according to the present disclosure includes a first substrate, an expanded second substrate, and a through electrode. The first substrate has a first principal surface on which circuit components are provided and over which a first surface layer, including a first electrode, is provided. The expanded second substrate includes: a second substrate having a second principal surface on which circuit components are provided; a resin portion provided on a side surface of the second substrate; and a second surface layer which is provided over an expanded second principal surface defined by the second substrate and the resin portion surrounding the second substrate and which includes a second electrode. The expanded second substrate is directly bonded to the first substrate such that the second surface layer contacts with the first surface layer. The through electrode either is connected to the first electrode and runs through the first substrate or is connected to the second electrode and runs through the second substrate. The second substrate has a smaller planar size than the first substrate, and the first and second electrodes are connected together and are in contact with each other.

In one embodiment of the semiconductor device, the second substrate may include a second substrate body and an interconnect layer provided between the second substrate body and the second surface layer, and the second surface layer may be a redistribution layer.

In another embodiment of the semiconductor device, the first substrate may include a first substrate body and an interconnect layer provided between the first substrate body and the first surface layer, and the first surface layer may be a redistribution layer.

In another embodiment of the semiconductor device, the through electrode may run through the first substrate, and the first substrate may be thinner than the second substrate.

In another embodiment of the semiconductor device, the through electrode may run through the second substrate, and the second substrate may be thinner than the first substrate.

In another embodiment of the semiconductor device, the first and second electrodes may be made of a material including copper, aluminum, nickel or tungsten.

In another embodiment of the semiconductor device, the first surface layer may include a first insulating film surrounding the first electrode, the second surface layer may include a second insulating film surrounding the second electrode, and the first and second insulating films may be made of silicon oxide, silicon nitride or a photosensitive resin.

In another embodiment of the semiconductor device, at least one of the first and second substrates may be a memory chip including a memory element.

In another embodiment of the semiconductor device, at least one of the first and second substrates may be a sensor chip including a sensor element.

An implementation of a method for making a semiconductor device according to the present disclosure comprises the steps of: providing a first wafer including a plurality of first regions, each having a first principal surface on which circuit components are provided and over which a first surface layer, including a first electrode, is provided; providing a second wafer including: a plurality of pre-chips, each having a second principal surface on which circuit components are provided, the pre-chips being smaller than the first regions; a resin portion provided between the pre-chips; and a second surface layer which is provided over an expanded second principal surface defined by the pre-chips and the resin portion surrounding the pre-chips and which includes a second electrode; forming a stack of wafers by directly bonding the first and second wafers together with the first and second surface layers brought into direct contact with each other; forming through electrodes which run through either the first regions or the pre-chips; and dicing, after the step of forming the through electrodes, the stack of wafers. In the step of forming the stack of wafers, the first and second electrodes are connected together so as to contact with each other.

In one embodiment of the method, the step of providing the second wafer may include the steps of: providing the pre-chips; arranging the pre-chips on a supporting substrate with an interval corresponding to that of the first regions left between the pre-chips; forming a resin portion by filing the gap between the pre-chips with a resin; and forming the second surface layer over the expanded second principal surface.

A semiconductor device and method for making the device according to the present disclosure provide a semiconductor device that allows for carrying out wafer-on-wafer stacking easily.

BRIEF DESCRIPTION OF THE DRAWINGS

FIGS. 3A to 3C are cross-sectional views illustrating respective manufacturing process steps to make the semiconductor device of that embodiment.

DETAILED DESCRIPTION

Figure 1A:
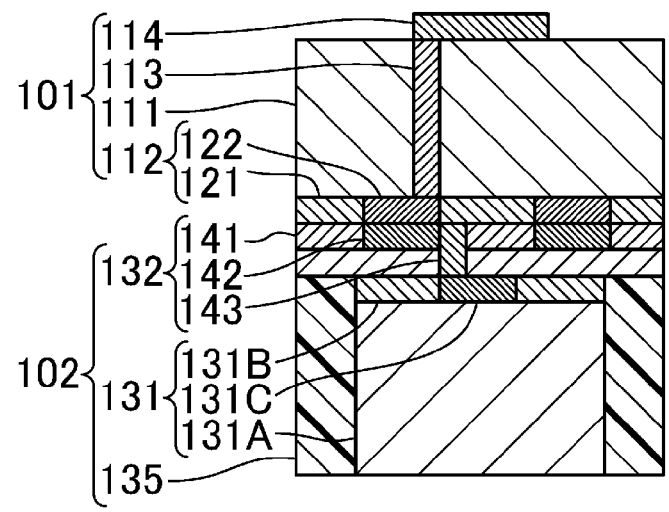
FIG. 1A is a cross-sectional view illustrating a semiconductor device according to an embodiment.

In following description of the present disclosure, the "principal surface" of a substrate or wafer will refer to not only the principal surface itself of the substrate or wafer body, but also that principal surface with everything provided thereon, including all of various kinds of elements provided on the substrate body or wafer body, interconnect layers connecting those elements together, and their surface coating as well.

Also, in the following description, if we say "A is provided or arranged over B", the statement refers herein to both a situation where some other member is interposed between A and B and a situation where A and B are in contact with each other.

Furthermore, the numerical values, shapes, materials, elements, number of the elements, their arrangements and connections, steps, order of the steps and various other parameters stated in the following description of embodiments are merely examples, and do not limit the scope of the present disclosure in any way. Also, those elements mentioned in the following description of embodiments which are not included in any of the independent claims defining the most basic concept of the present disclosure will be described as "optional" or "additional" elements. Furthermore, if any pair of elements that are shown on multiple drawings are identified by the same reference numeral there, their description will be sometimes omitted to avoid redundancies, once one of them is described herein. Moreover, on the drawings, respective elements are illustrated just schematically for the sake of simplicity of illustration, and therefore, their shapes, size ratios and other properties are not always exactly the same as the actual ones. Besides, in the manufacturing process, the order of the respective process steps to perform may be changed, and/or any known process steps may be added, as needed.

Figure 1B:
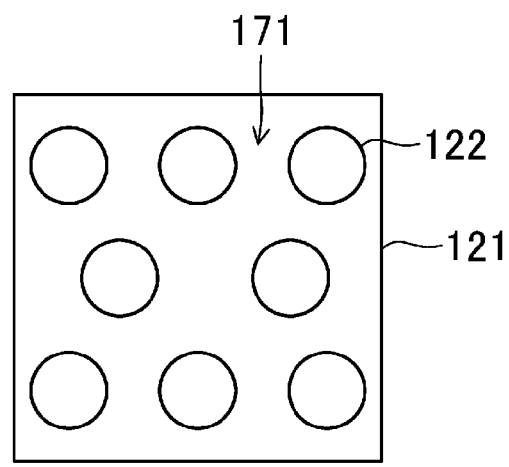
FIG. 1B is a plan view illustrating a first substrate yet to be stacked.
Figure 1C:
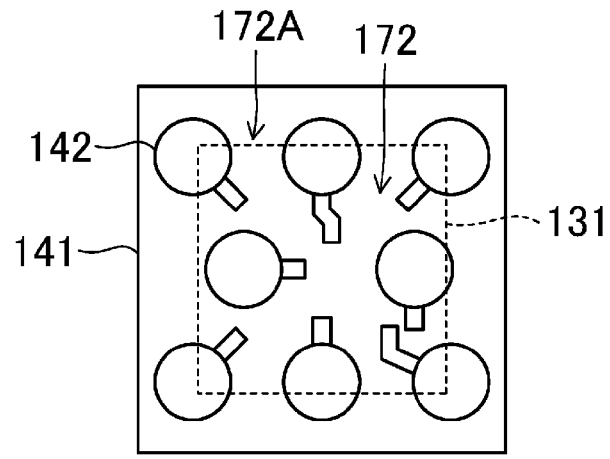
FIG. 1C is a plan view illustrating an expanded second substrate yet to be stacked.

FIGS. 1A to 1C illustrate a semiconductor device according to an embodiment of the present disclosure. As shown in FIGS. 1A to 1C, a semiconductor device according to this embodiment is a stack of semiconductor chips in which a first substrate 101 configured as a semiconductor chip and an expanded second substrate 102 configured as a resin-expanded semiconductor chip are stacked one upon the other via direct bonding. Specifically, FIG. 1A illustrates a cross section of the semiconductor device. FIG. 1B illustrates a first principal surface 171 of the first substrate 101 yet to be stacked on the other substrate. FIG. 1C illustrates an expanded second principal surface 172A of the expanded second substrate 102 yet to be stacked on the other substrate.

The first substrate 101 includes: a first substrate body 111 having a first principal surface 171 (that is a circuitry side thereof) on which circuit elements such as transistors (not shown) are arranged; a first surface layer 112 provided over the first principal surface 171; and through electrodes 113 which run through the first substrate body 111. The first surface layer 112 includes a first insulating film 121 provided over the first principal surface 171; and first electrodes 122 surrounded with the first insulating film 121. In this embodiment, the first surface layer 112 is an interconnect layer provided over the first substrate body 111. If necessary, however, the first surface layer 112 may include interconnects connecting the circuit elements together and interconnects connecting the circuit elements to the first electrodes 122. Although the first surface layer 112 illustrated in FIG. 1A is a single layer, the first surface layer 112 may also have a multilevel interconnect structure in which a plurality of interconnect layers are stacked one upon the other.

The expanded second substrate 102 includes a second substrate 131, a resin portion 135 provided on the side surface of the second substrate 131 to surround the second substrate 131, and a second surface layer 132 arranged over the second substrate 131. The second substrate 131 includes a second substrate body 131A on which circuit elements such as transistors (not shown) are provided on a second principal surface 172 (that is a circuitry side), a protective insulating film 131B provided over the second substrate body 131A, and pad electrodes 131C surrounded with the protective insulating film 131B. The second surface layer 132 is provided over an expanded second principal surface 172A defined by the second principal surface 172 of the second substrate 131 and the resin portion 135 surrounding the second principal surface. The second surface layer 132 includes a second insulating film 141 provided over the expanded second principal surface 172A and second electrodes 142 surrounded with the second insulating film 141.

Figure 8:
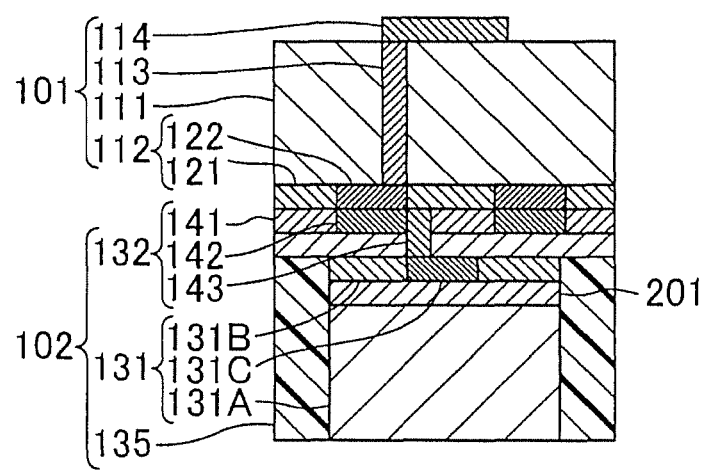
FIG. 8 is a cross-sectional view illustrating a semiconductor device according to another variation of that embodiment.

In this embodiment, the second surface layer 132 is a redistribution layer provided over the expanded second principal surface 172A. Although the second surface layer 132 illustrated in FIG. 1 has a double layer structure, the second surface layer 132 may be comprised of any other number of layers. The second substrate 131 includes the second substrate body 131A, the protective insulating film 131B provided over the principal surface of the second substrate body 131A, and the pad electrodes 131C. The pad electrodes 131C are connected to the second electrodes 142 through via metals 143. Optionally, as shown in FIG. 8 an interconnect layer 201 including interconnects to connect together the circuit elements and interconnects to connect the circuit elements to the pad electrodes 131C may be provided between the second substrate body 131A and the pad electrodes 131C. The interconnect layer may be comprised of either a single layer or two or more layers.

The first substrate 101 and the expanded second substrate 102 are directly bonded together with no adhesive layer interposed between the first and second surface layers 112 and 132. In this description, the "direct bonding" refers herein to bonding two smooth surfaces together by using surface attraction between them without interposing any adhesive member between them. The first and second electrodes 122 and 142 are arranged to face each other. The first and second electrodes 122 and 142 are connected together directly in contact with each other with no solder, conductive adhesive, bump or any other bonding member interposed between them, and are electrically conductive with each other.

The first electrodes 122 are connected to the through electrodes 113, which are in turn connected to redistributions 114 that are provided on the back surface opposite from the first principal surface 171 of the first substrate body 111. Thus, the second electrodes 142 are connected to the redistributions 114 via the first electrodes 122 and the through electrodes 113.

In the semiconductor device of this embodiment, the second principal surface 172 of the second substrate 131 has a smaller planar size then the first principal surface 171 of the first substrate 101. However, the expanded second substrate 102 does include the resin portion 135 that is provided on the side surface of the second substrate 131 to expand the second substrate 131. Therefore, the expanded second principal surface 172A defined by the second substrate 131 and the resin portion 135 surrounding the second substrate 131 has substantially the same planar size as the first principal surface 171. This thus enables wafer-on-wafer stacking even without increasing the area of the second substrate 131 itself.

The first substrate 101 and the expanded second substrate 102 are stacked face to face one upon the other. The second electrodes 142 of the expanded second substrate 102 are extended onto the back surface of the first substrate 101. The through electrodes 113 that extend the second electrodes 142 are provided for the first substrate body 111 that is a silicon substrate. That is why the through electrodes 113 may be formed by an ordinary silicon process, thus facilitating the process design.

In the semiconductor device of this embodiment, the second substrate 131 that is a semiconductor chip is expanded with a resin into the expanded second substrate 102, and the second electrodes 142 provided in the second surface layer 132 over the expanded second substrate 102 are connected to the first electrodes 122 of the first substrate 101. Thus, the layout of the pad electrodes 131C of the second substrate 131 does not have to agree with that of the first electrodes 122 of the first substrate 101. In addition, there is no need to provide any through electrode 113 and its associated interconnect for the second substrate 131. Consequently, even a chip that is not designed cooperatively for wafer-on-wafer stacking may be used easily as the second substrate 131. Furthermore, the second electrodes 142 may be arranged on the expanded second principal surface 172A that is broader than the second principal surface 172, thus increasing the flexibility of layout design of the second electrodes 142.

Figure 2:
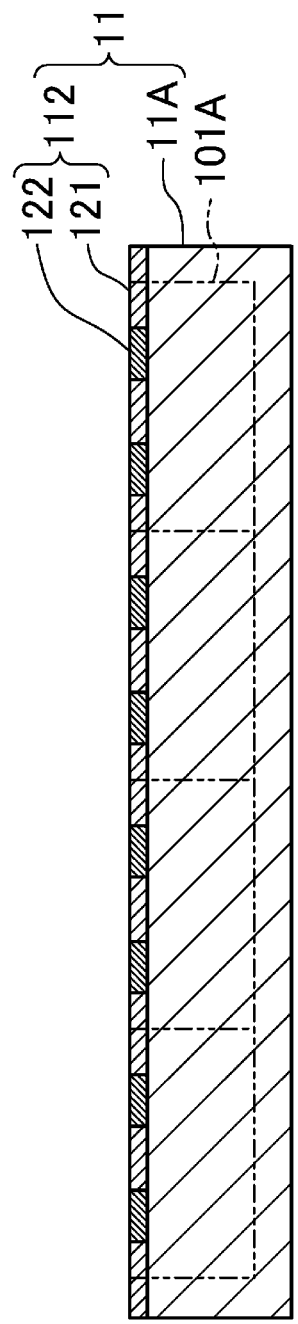
FIG. 2 is a cross-sectional view illustrating a manufacturing process step to make a semiconductor device according to an embodiment.

Next, it will be described how to make a semiconductor device according to this embodiment. First of all, as shown in FIG. 2, a first wafer 11, including a plurality of first regions 101A to be first substrates 101, is provided. The first wafer 11 may be provided by forming circuit elements on the circuitry side of a first wafer body 11A (which may be implemented as a silicon wafer, for example) and then forming a first surface layer 112 over the first wafer body 11A. The first surface layer 112 includes a first insulating film 121 and first electrodes 122 exposed out of the first insulating film 121. The first insulating film 121 may be a silicon oxide film, a silicon nitride film or an insulating film of a photosensitive resin, for example. The first electrodes 122 may be made of copper, aluminum, nickel, tungsten, or an alloy thereof. The first surface layer 112 may be formed by some interconnect forming technique such as a damascene process, a semi-additive process, or a stacking process for use to make aluminum interconnects. The first surface layer 112 may include, as needed, interconnects to connect the circuit elements together and interconnects to connect the circuit elements to the first electrodes 122. The first surface layer 112 may be configured as a stack of multiple interconnect layers.

Next, a second wafer 12 is provided as an expanded wafer. FIGS. 3A to 3C illustrate how the second wafer 12 may be formed. First of all, second substrates 131 are provided as pre-chips. Each of the second substrates 131 includes a second substrate body 131A including circuit elements (not shown) on its circuitry side, and a protective insulating film 131B and pad electrodes 131C provided on the principal surface of the second substrate body 131A. The second substrates 131 may be provided in the following manner, for example. Specifically, first, circuit elements are formed on the circuitry side of a wafer. Next, a protective insulating film 131B and pad electrodes 131C are formed over the principal surface of the wafer on which the circuit elements have been formed. Thereafter, the wafer is diced and divided into respective chips to obtain second substrates 131. If necessary, an interconnect layer may be formed between the second substrate body 131A, protective insulating film 131B and pad electrodes 131C.

Next, as shown in FIG. 3A, the second substrates 131 are mounted facedown on a supporting substrate 151 with an adhesive layer 152 so that the pad electrodes 131C face the supporting substrate 151. The adhesive layer 152 may be an easily removable adhesive, for example. Each of the second substrates 131 has a smaller planar size than an associated one of the first regions 101A of the first wafer 11. The second substrates 131 are arranged on the supporting substrate 151 at an interval that agrees with the arrangement interval (i.e., pitch) of the first regions 101A.

Subsequently, as shown in FIG. 3B, the gaps between the second substrates 131 are filled with a resin, which is then allowed to cure. Thereafter, when the resin is cured, the surface of the second substrates 131 is polished, thereby obtaining a second wafer body 12A including a resin portion 135 between the second substrates 131.

Next, as shown in FIG. 3C, the second wafer body 12A is stripped from the supporting substrate 151, and then a second surface layer 132 including a second insulating film 141, second electrodes 142 and via metals 143, is formed over the second wafer body 12A to complete a second wafer 12. The second surface layer 132 may be formed by an ordinary redistribution forming method. The second electrodes 142 are formed to be aligned with their corresponding first electrodes 122. The second insulating film 141 may be a silicon oxide film, a silicon nitride film or an insulating film of a photosensitive resin, for example. The second insulating film 141 may be made of the same material as, or a different material from, the first insulating film 121. The second electrodes 142 may be made of copper, aluminum, nickel, tungsten, or an alloy thereof. The second electrodes 142 may be made of the same material as, or a different material from, the first electrodes 122.

Figure 4:
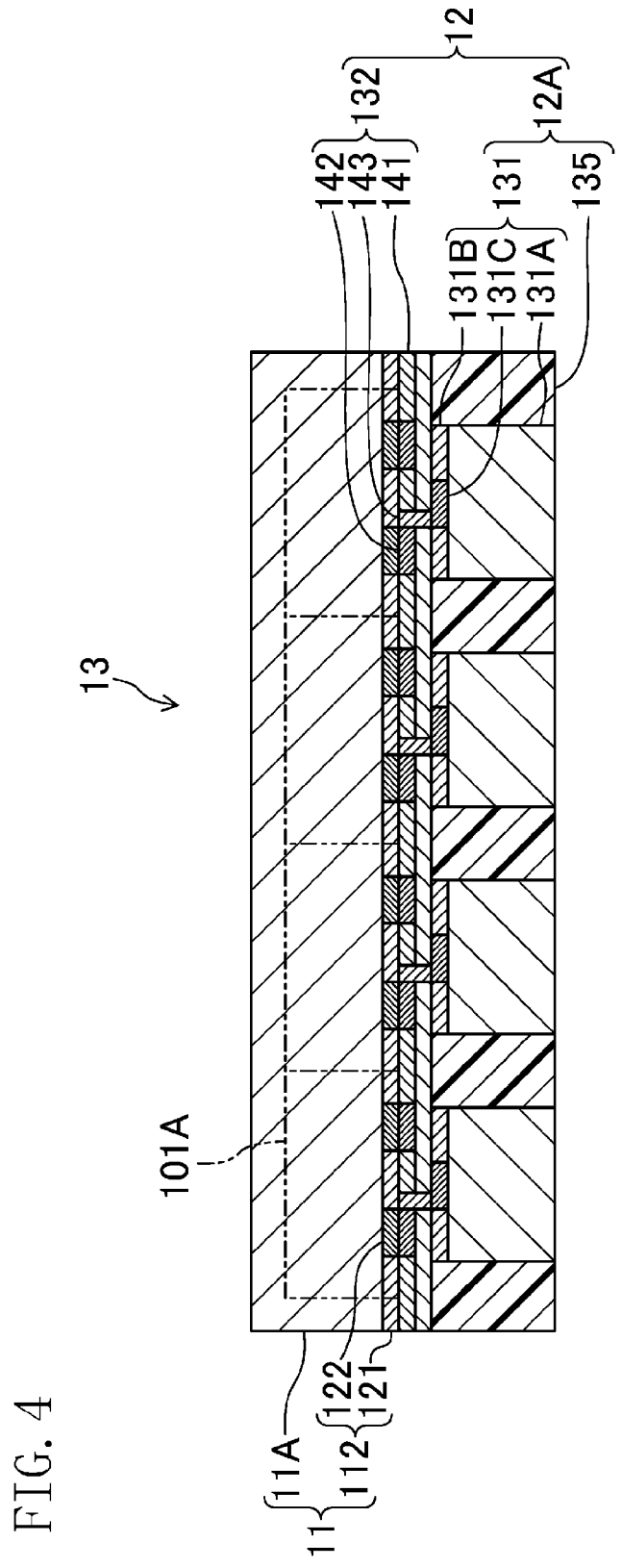
FIG. 4 is a cross-sectional view illustrating another manufacturing process step to make the semiconductor device of that embodiment.

Subsequently, as shown in FIG. 4, the first and second wafers 11 and 12 are bonded together by direct bonding to form a stack of wafers 13. To prepare for this direct bonding, the first surface layer 112 of the first wafer 11 and the second surface layer 132 of the second wafer 12 have their surface polished and planarized by chemical mechanical polishing (CMP) process. To facilitate this bonding process, the first and second surface layers 112 and 132 may have an upwardly raised shape as a whole. The first and second surface layers 112 and 132 thus planarized are subjected to a surface treatment and then brought into contact with each other. In this manner, the first and second surface layers 112 and 132 are bonded together by surface attraction. The surface treatment may be carried out on the first and second surface layers 112 and 132 by introducing dangling bonds thereto through an exposure to plasma or by terminating with a hydroxyl group or an amino group, for example. Before being subjected to the surface treatment, their surface may be cleaned by either wet cleaning or dry cleaning.

If dangling bonds have been introduced thereto, the dangling bonds themselves bond to each other between the first and second insulating films 121 and 141 by bringing the first and second surface layers 112 and 132 into contact with each other. On the other hand, if a hydroxyl group, an amino group or any other group has been introduced thereto, hydrogen bonds are produced between the first and second insulating films 121 and 141. Since bonds are formed between the first and second electrodes 122 and 142 using metallic bonds, intermolecular force or a crystal structure, the first and second electrodes 122 and 142 can be electrically conductive with each other with no solder or adhesive interposed between them. If the first and second electrodes 122 and 142 need to form a metallic bond between them, the first and second electrodes 122 and 142 may be made of the same material. Optionally, after the first and second wafers 11 and 12 have been directly bonded together, a heat treatment may be carried out. The heat treatment allows for further increasing the strength of the bond between the first and second wafers 11 and 12, and may be carried out at a temperature of 400° C. or less.

Figure 5:
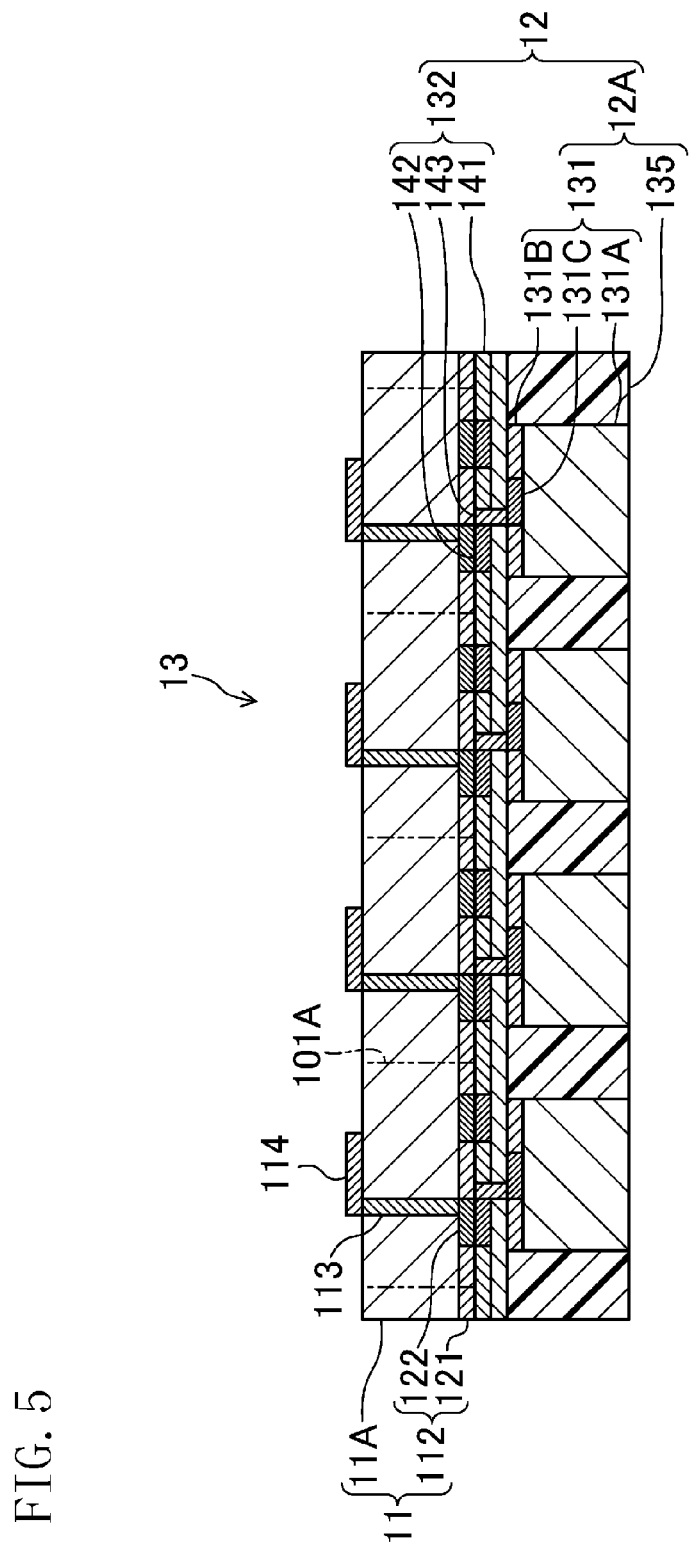
FIG. 5 is a cross-sectional view illustrating another manufacturing process step to make the semiconductor device of that embodiment.

Next, as shown in FIG. 5, the stack of wafers 13 is polished from the back surface of the first wafer 11 to reduce the thickness of the first wafer body 11A. The first wafer 11 may be polished by performing grinding with a grinder or any other appropriate machine and polishing by CMP process in combination. Thereafter, through electrodes 113 running through the first wafer body 11A and redistributions 114 connected to the through electrodes 113 are formed. The through electrodes 113 and redistributions 114 may be formed by an ordinary method. By reducing the thickness of the first wafer body 11A before forming the through electrodes 113, the through electrodes 113 are formed more easily. In this case, the first wafer body 11A may become thinner than the second wafer body 12A. In that case, in the resultant stack of semiconductor chips, the first substrate 101 becomes thinner than the second substrate 131. In this example, the through electrodes 113 are supposed to be formed after the first and second wafers 11 and 12 have been stacked one upon the other. However, the first and second wafers 11 and 12 may be stacked one upon the other after the through electrodes 113 have been formed.

Figure 6:
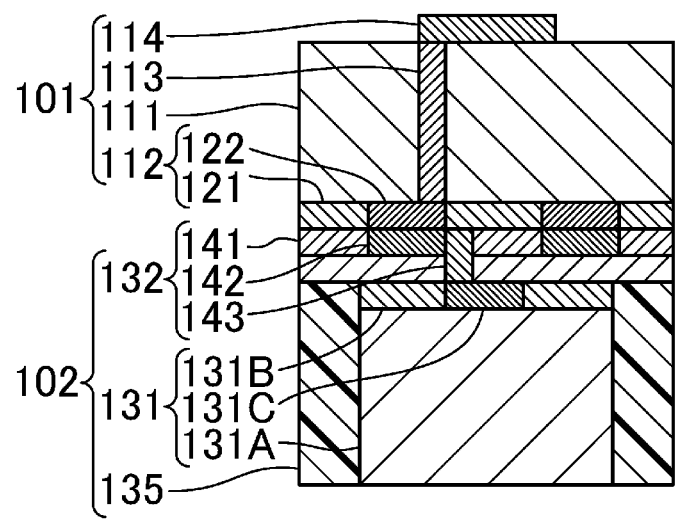
FIG. 6 is a cross-sectional view illustrating another manufacturing process step to make the semiconductor device of that embodiment.

Thereafter, as shown in FIG. 6, the stack of wafers 13 is diced and divided into respective chips using the first regions 101A as a reference. In this manner, stacks of semiconductor chips, in each of which the first substrate 101 and the expanded second substrate 102 are stacked one upon the other, are obtained.

In this embodiment, the second surface layer 132 is supposed to be used as a redistribution layer provided over the second substrate 131 that has been expanded with a resin. Also, the through electrodes 113 are supposed to be provided for the first substrate 101. Thus, a semiconductor chip that is not designed cooperatively for a stack of semiconductor chips may be used easily as the second substrate 131. Consequently, a semiconductor chip manufactured by another company, the use of which makes it difficult to make such a cooperative design, and a semiconductor chip manufactured by one's own company are easily stackable one upon the other.

Figure 9:
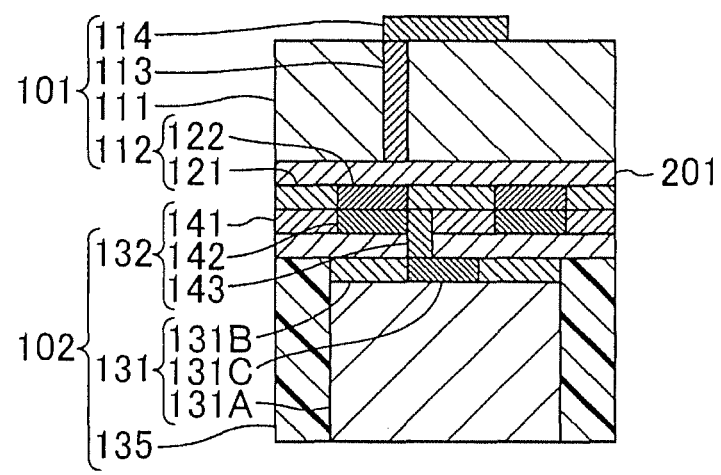
FIG. 9 is a cross-sectional view illustrating a semiconductor device according to yet another variation of that embodiment.

In the embodiment described above, the first surface layer 112 is supposed to be used as an interconnect layer provided over the first substrate body 111. However, as shown in FIG. 9 the first surface layer 112 may also be used as a redistribution layer provided over the interconnect layer 201. Use of the first surface layer 112 as a redistribution layer makes it easier to design the layout of the first substrate 101. Also, although the protective insulating film 131B and the pad electrodes 131C are supposed to be interposed between the second substrate body 131A and the second surface layer 132 in the embodiment described above, the second surface layer 132 may be configured to function as an interconnect layer with no pad electrodes 131C provided.

Figure 7:
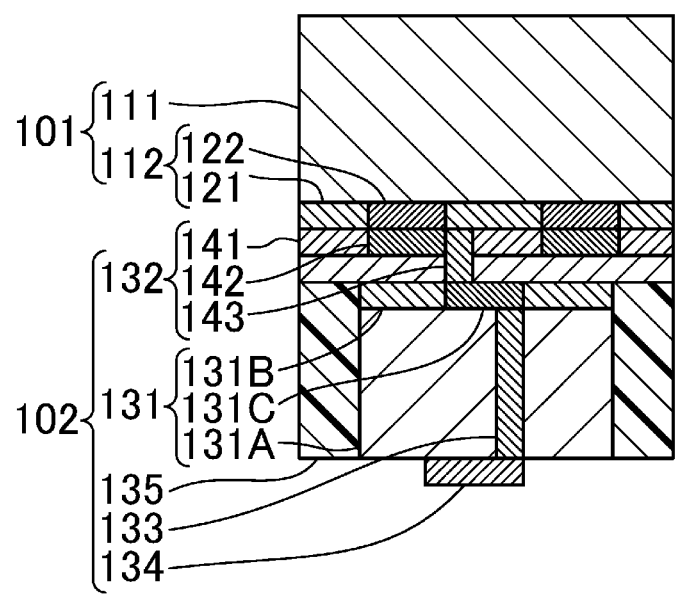
FIG. 7 is a cross-sectional view illustrating a semiconductor device according to a variation of that embodiment.

In the embodiment described above, the through electrodes 113 and redistributions 114 are supposed to be provided for the first substrate 101. However, as shown in FIG. 7, the through electrodes 133 and redistributions 134 may be provided for the expanded second substrate 102. The through electrodes 133 are provided to run through the second substrate body 131A that is a silicon substrate. If the through electrodes 133 are provided for the expanded second substrate 102, the thickness of the second substrate body 131A may be reduced by polishing the back surface of the second wafer 12 before the through electrodes 133 are provided. In that case, the second substrate 131 may have a smaller thickness than the first substrate 101. Even if the through electrodes 133 are provided for the expanded second substrate 102, the first surface layer 112 may also be used as a redistribution layer. Then, a semiconductor chip that is not designed for wafer-on-wafer stacking may be used easily as the first substrate 101 of the larger size. Optionally, a configuration in which no pad electrodes 131C are provided on the second substrate body 131A may also be used.

In the embodiment described above, the first and second substrates may be configured as any kinds of semiconductor chips. For example, at least one of the first and second substrates may be a memory chip, or at least one of the first and second substrates may be a chip including a sensor. The first and second substrates may be chips of different kinds but may also be chips of the same kind.

In the semiconductor device of the embodiment described above, the respective numbers of first and second electrodes to provide may be determined depending on the necessity. Also, even though only one through electrode and only one redistribution are illustrated, the respective numbers of through electrodes and redistributions to provide may also be determined depending on the necessity. The through electrodes and redistributions may have any arbitrary shapes as long as electrical conductivity is ensured. For example, although the through electrodes may be formed by filling through holes cut through a substrate body with an electrically conductive material, a conductive film may be deposited in a ring shape on the inner wall of the through holes. In that case, an insulating film may be further embedded inside the central opening of the conductive film. Furthermore, the through electrodes may be made of any material. As a material for the through electrodes and redistributions, copper, polysilicon or tungsten may be used, for example.

A semiconductor device and method for making the device according to the present disclosure makes it easy to carry out wafer-on-wafer stacking and is particularly useful as a stack of semiconductor chips and method for making such a stack.

The invention claimed is:

1. A semiconductor device comprising
a first substrate having a first principal surface on which circuit components are provided and over which a first surface layer, including a first electrode, is provided,
an expanded second substrate including: a second substrate having a second principal surface on which circuit components are provided; a resin portion provided on a side surface of the second substrate; and a second surface layer which is provided over an expanded second principal surface defined by the second substrate and the resin portion surrounding the second substrate and which includes a second electrode, the expanded second substrate being directly bonded to the first substrate such that the second surface layer contacts in its entirety with the first surface layer, and
a through electrode which either is connected to the first electrode and runs through the first substrate or is connected to the second electrode and runs through the second substrate, wherein
the second substrate has a smaller planar size than the first substrate, and
the first and second electrodes are connected together and are in contact with each other.

2. The semiconductor device of claim 1, wherein
the second substrate includes a second substrate body and an interconnect layer provided between the second substrate body and the second surface layer, and
the second surface layer is a redistribution layer.

3. The semiconductor device of claim 1, wherein
the first substrate includes a first substrate body and an interconnect layer provided between the first substrate body and the first surface layer, and
the first surface layer is a redistribution layer.

4. The semiconductor device of claim 1, wherein
the through electrode runs through the first substrate, and
the first substrate is thinner than the second substrate.

5. The semiconductor device of claim 1, wherein
the through electrode runs through the second substrate, and
the second substrate is thinner than the first substrate.

6. The semiconductor device of claim 1, wherein the first and second electrodes are made of a material including copper, aluminum, nickel or tungsten.

7. The semiconductor device of claim 1, wherein
the first surface layer includes a first insulating film surrounding the first electrode,
the second surface layer includes a second insulating film surrounding the second electrode, and
the first and second insulating films are made of silicon oxide, silicon nitride or a photosensitive resin.

8. The semiconductor device of claim 1, wherein at least one of the first and second substrates is a memory chip including a memory element.

9. The semiconductor device of claim 1, wherein at least one of the first and second substrates is a sensor chip including a sensor element.

10. A semiconductor device comprising
a first substrate having a first principal surface on which circuit components are provided and over which a first surface layer, including a first electrode, is provided,
an expanded second substrate including: a second substrate having a second principal surface on which circuit components are provided; a resin portion provided on a side surface of the second substrate; and a second surface layer which is provided over an expanded second principal surface defined by the second substrate and the resin portion surrounding the second substrate and which includes a second electrode, the expanded second substrate being directly bonded to the first substrate such that the second surface layer contacts with the first surface layer, and
a through electrode which either is connected to the first electrode and runs through the first substrate or is connected to the second electrode and runs through the second substrate, wherein
the second substrate has a smaller planar size than the first substrate, and the first and second electrodes are connected together and directly in contact with each other without interposing any other member between the first and second electrodes.

11. The semiconductor device of claim 10, wherein
the second substrate includes a second substrate body and an interconnect layer provided between the second substrate body and the second surface layer, and
the second surface layer is a redistribution layer.

12. The semiconductor device of claim 10, wherein
the first substrate includes a first substrate body and an interconnect layer provided between the first substrate body and the first surface layer, and
the first surface layer is a redistribution layer.

13. The semiconductor device of claim 10, wherein
the through electrode runs through the first substrate, and
the first substrate is thinner than the second substrate.

14. The semiconductor device of claim 10, wherein
the through electrode runs through the second substrate, and
the second substrate is thinner than the first substrate.

15. The semiconductor device of claim 10, wherein the first and second electrodes are made of a material including copper, aluminum, nickel or tungsten.

16. The semiconductor device of claim 10, wherein
the first surface layer includes a first insulating film surrounding the first electrode,
the second surface layer includes a second insulating film surrounding the second electrode, and
the first and second insulating films are made of silicon oxide, silicon nitride or a photosensitive resin.

17. The semiconductor device of claim 10, wherein at least one of the first and second substrates is a memory chip including a memory element.

18. The semiconductor device of claim 10, wherein at least one of the first and second substrates is a sensor chip including a sensor element.

* * * * *